US006667883B1

United States Patent
Solis et al.

(10) Patent No.: US 6,667,883 B1
(45) Date of Patent: Dec. 23, 2003

(54) FORCED-AIR COOLING OF A TRANSCEIVER UNIT

(75) Inventors: Craig Solis, San Jose, CA (US); Peter Smidth, San Luis Obispo, CA (US)

(73) Assignee: Proxim Corporation, Sunnyvale, CA (US)

(*) Notice: Subject to any disclaimer, the term of this patent is extended or adjusted under 35 U.S.C. 154(b) by 0 days.

(21) Appl. No.: 10/231,523

(22) Filed: Aug. 29, 2002

(51) Int. Cl.[7] ............................................. H05K 7/20
(52) U.S. Cl. ................. 361/695; 165/80.3; 165/122; 361/690; 361/715; 361/735; 454/184
(58) Field of Search ................. 165/80.3, 121, 165/122, 126, 185; 62/259.2; 312/236; 361/687–690, 694–695, 724, 732, 715, 735, 744, 759, 802; 654/184

(56) References Cited

U.S. PATENT DOCUMENTS

| 4,501,460 A | * | 2/1985 | Sisler | 361/744 |
| 5,067,040 A | * | 11/1991 | Fallik | 361/694 |
| 5,138,523 A | * | 8/1992 | Benck et al. | 361/704 |
| 5,335,144 A | * | 8/1994 | Maroushek | 361/695 |
| 5,440,450 A | * | 8/1995 | Lau et al. | 361/695 |
| 5,544,969 A | * | 8/1996 | Ammon et al. | 361/744 |
| 6,297,958 B1 | * | 10/2001 | Lutz, Jr. | 361/690 |
| 6,522,540 B2 | * | 2/2003 | Sakaiya et al. | 361/697 |

* cited by examiner

Primary Examiner—Gregory Thompson
(74) Attorney, Agent, or Firm—Thelen Reid & Priest, LLP

(57) ABSTRACT

The present invention provides for cooling a plurality of racked electronic devices having a first electronic device having at least one cooling vent at a first end and a plurality of cooling holes at a top, each of the cooling vents having a cooling fan, means for flowing air through the cooling vent, means for outputting the air flow through a plurality of cooling holes on the top of the first electronic device. The present invention further provides for a second electronic device having a plurality of heat sink fins on the bottom. The bottom of the second electronic device coupled to the top of said first electronic device, means for aligning the plurality of cooling holes under the plurality of heat sink fins, and means for outputting the air through an output of the heat sink fins.

32 Claims, 4 Drawing Sheets

FORCED-AIR COOLING OF A TRANSCEIVER UNIT

FIELD OF THE INVENTION

The present invention relates to heat dissipation. More specifically, the invention relates to heat dissipation in racked electronic devices.

BACKGROUND OF THE INVENTION

Some electronic devices, such as transceivers are mounted on poles or masts outside buildings next to antennas for better system gain since the cables are shorter in length. Longer cables equals less gain and more loss. However, some users may prefer to have the electronic devices, such as the transceivers, racked inside a building for use in wireless networking equipment and for convenience. For example, the cables are shorter in length and therefore less loss is realized. Moreover, the electronic device is out of the elements and in a controlled enviroment where it is easier to service if it should malfunction. However, once out of the elements, there needs to be a way to keep the electronic device cooled while racked.

Long-term protection of sensitive circuits and electronic components is important in many of today's delicate and demanding electronic applications. With the trend toward smaller and more compact electronic modules, the need for thermal management is growing.

The heat that is generated by an electronic device must be transferred away from the electronic device or the performance of the electronic device(s) will deteriorate. The problem of dissipating heat from electronic devices becomes difficult when the circuit board within the electronic device is mounted within a housing. For example, fiber optic transmitter/receiver modules that include circuit boards are often environmentally sealed in a housing to prevent damage from the elements. As a result, the ability to dissipate heat from the electronic devices mounted on the circuit boards becomes challenging. The environmental housing's only mode of heat transfer to the ambient is natural convection. The transmitter/receiver module's only mode of heat transfer to the environmental housing is conduction.

Integrated circuit devices, such as microprocessors, DRAMs, and ASICs may contain millions of transistors. These integrated circuit devices, which may be mounted directly on a support structure (e.g., printed wiring boards or ceramic boards) or encapsulated in plastic packages, generate large amounts of heat during operation. Heat increases a device's electrical resistance, which slows down the device and may affect the device's overall performance. Heat also accelerates wear and tear on the device and may reduce a device's overall life expectancy. Metal can also cause corrosion of metal liners used in the integrated circuit. These factors make adequate heat dissipation important to system performance. Therefore, it is desirable to remove heat from electronic devices and generally keep them as cool as possible during operation.

Heat is both a chemical and physical property of matter and a fundamental component of electronic devices. Heat moves through solid materials by radiation and conduction and through fluids by convection. Conductive heat transfer occurs when energy exchange takes place by direct impact of molecules from a high temperature region to a low temperature region. Heat is moved directly from one material to another with which it is in contact. Heat travels through material like metal, stone, brick and wood very easily, but heat travels relatively slowly through materials like fiberglass or dry foam. In highly conductive materials, heat will move as vibrations directly along the continuous metallic or crystalline bonds. In more resistant materials, the molecular bonds do not vibrate as freely and they are interrupted. When the position of heat particles is less restrained, the more powerful the heat transfer convection process.

To accomplish the objective of heat conduction, it has been conventional practice to use very complex and expensive chassis-integrated heat transfer structures. Another practice is to use more thermally robust circuit components, which undesirably add substantial bulk to the overall housing assembly and is costly. However, there is currently no way to efficiently dissipate heat when devices are stacked.

Thus, there remains a need for an efficient way to dissipate heat from multiple electronic devices. More specifically, there is a need for an efficient way to dissipate heat in stacked electronic devices.

BRIEF DESCRIPTION OF THE INVENTION

The present invention provides for cooling a plurality of racked electronic devices having a first electronic device having at least one cooling vent at a first end and a plurality of cooling holes at a top, each of the cooling vents having a cooling fan, means for flowing air through the cooling vent, means for outputting the air flow through a plurality of cooling holes on the top of the first electronic device. The present invention further provides for a second electronic device having a plurality of heat sink fins on the bottom. The bottom of the second electronic device coupled to the top of said first electronic device, means for aligning the plurality of cooling holes under the plurality of heat sink fins, and means for outputting the air through an output of the heat sink fins.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of forced-air cooling of a transceiver unit. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The present invention provides for a way to cool racked electronic devices. Many electronic devices are racked and contained within a building for convenience and ease of use. However, keeping the electronic devices cooled to prevent a decrease in the device's reliability, prevent wear and tear, and prevent corrosion of the electric device is important. Thus, the present invention provides for a way to cool the racked electronic device using conductive heat transfer.

Figure 1:
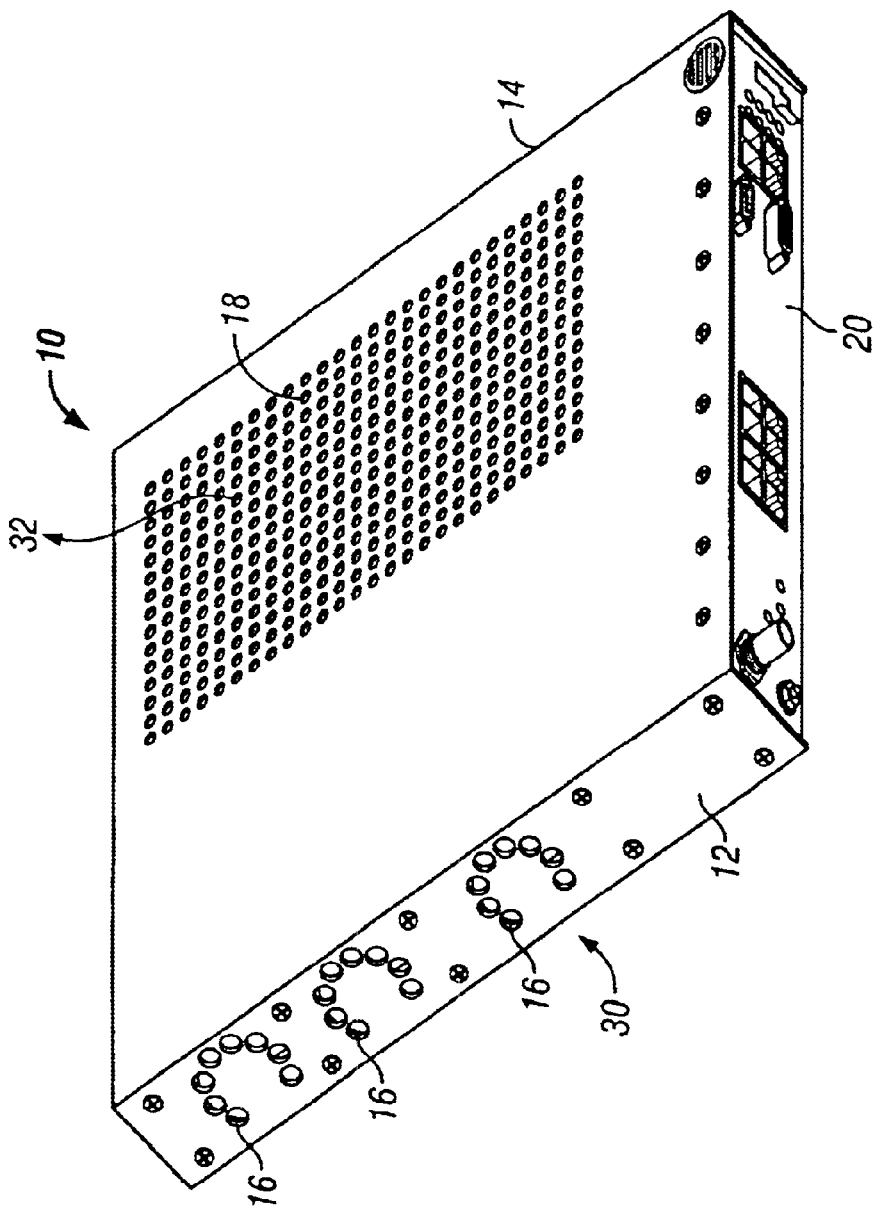
FIG. 1 is a diagram illustrating a transceiver (digital) in accordance with one embodiment of the present invention.

FIG. 1 is a diagram illustrating a transceiver (digital) in accordance with one embodiment of the present invention. The present invention is described using a digital and radio frequency (RF) transceiver. However, those of ordinary skill in the art will realize that the present invention may apply to other electronic devices such as a transmitter and a receiver. As shown in FIG. 1, the transceiver (digital) 10 has a first end 12 and a second end 14, the first end 12 opposite the second end 14. There are several cooling vents 16 located at the first end 12. Each of the cooling vents 16 have cooling fans (not shown) located within the transceiver (digital) 10 near each of the cooling vents 16. The cooling fans are rotated to provide for the input of air (a shown with arrow 30) through the transceiver (digital) 10 to cool the transceiver (digital). Those of ordinary skill in the art will now realize that any number of cooling vents, fans, and cooling holes may be used and is not intended to limit the present invention.

After flowing through the transceiver (digital), the air exits (as shown with arrow 32) the transceiver (digital), through a plurality of cooling holes 18 at the top 20 of the transceiver (digital) 10. The cooling holes 18 are located by the second end 14. The air exiting the cooling holes 18 will have a higher temperature than the air entering the cooling vents 16.

In another embodiment, the cooling vents 16 and cooling holes 32 are made of a conducting material such as cast powder coated aluminum. Those of ordinary skill in the art will now realize that the housing of the transceiver (digital) 10 may be made of the conducting material for effective heat dissipation. Heat travels through material like metal, stone, brick and wood very easily since the heat will move as vibrations directly along the continuous metallic or crystalline bonds. When the position of heat particles is less restrained, the more efficient the heat transfer convection process. Thus, for an efficient way to dissipate heat from the transceiver (digital) 10, the cooling vents 16 and cooling holes 32 should be made of a conducting material.

Figure 2:
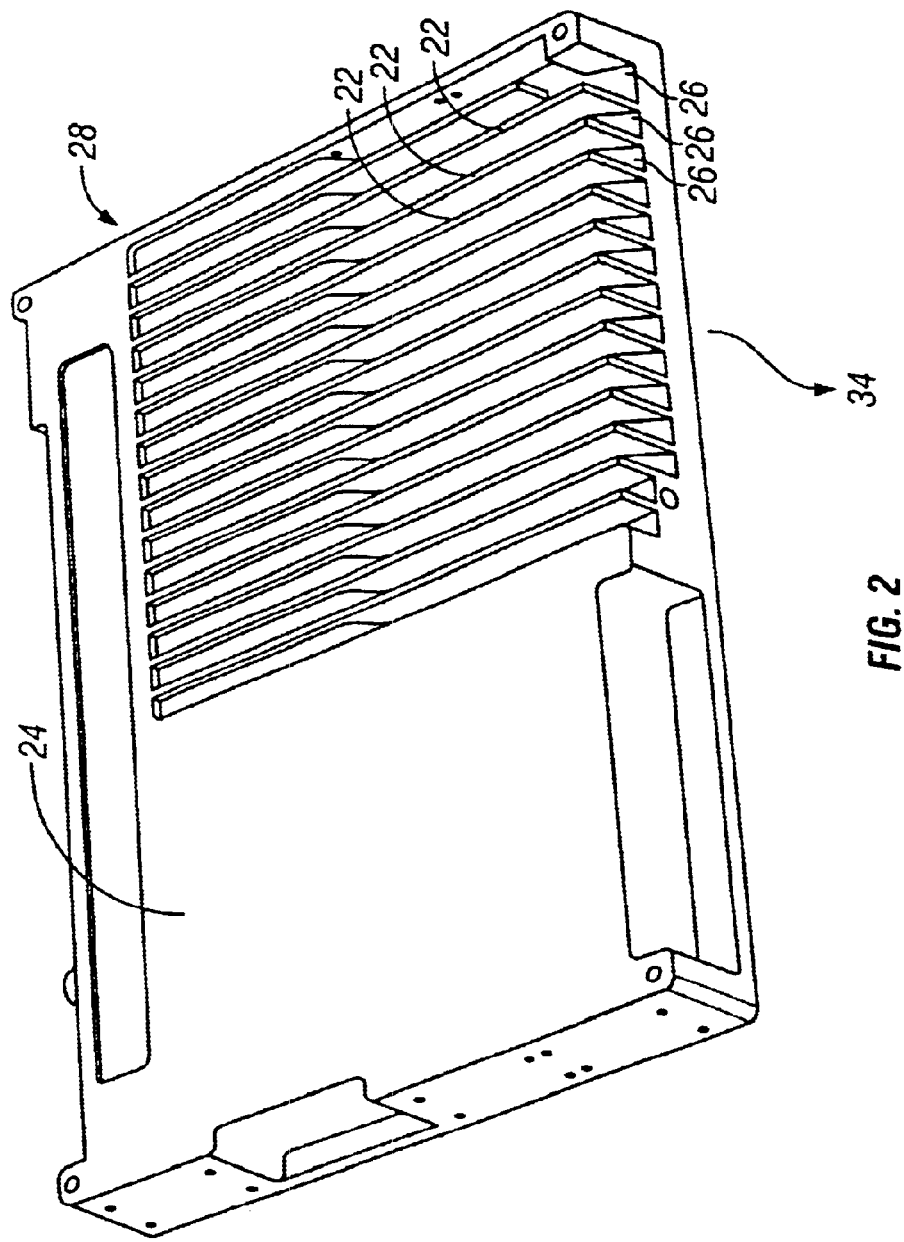
FIG. 2 is a diagram illustrating a transceiver (RF) in accordance with one embodiment of the present invention.

FIG. 2 is a diagram illustrating a transceiver (RF) in accordance with one embodiment of the present invention. The transceiver (RF) 28 has a plurality of heat sink fins 22 at the bottom 24 of the transceiver (RF) 28. The heat sink fins 22 provide an increase surface area to dissipate the heat from the transceiver (RF) 28. The spacing between each heat sink fin 22 creates channels for the forced air to escape through the output 26 while cooling the transceiver (RF) 28 and other heat sink fins 22 along the way to keep the transceiver (RF) cool. In one embodiment, the height of the heat sink fins may be dependent upon the rack mounting unit height, which may be about 1.75 inches tall. Those of ordinary skill in the art will now realize that any number of heat sink fins may be used and is not intended to limit the present invention.

In another embodiment, the heat sink fins 22 are made of a conducting material such as cast powder coated aluminum. Good heat transfer is dependent on a good interface between the heat-producing device and the heat transfer media. Those of ordinary skill in the art will now realize that the housing of the transceiver (RF) 28 may be made of the conducting material for effective heat dissipation. Heat travels through material like metal, stone, brick and wood very easily since the heat will move as vibrations directly along the continuous metallic or crystalline bonds. When the position of heat particles is less restrained, the more efficient the heat transfer convection process. Thus, for an efficient way to dissipate heat from the transceiver (RF) 28, the heat sink fins should be made of a conducting material.

Figure 3:
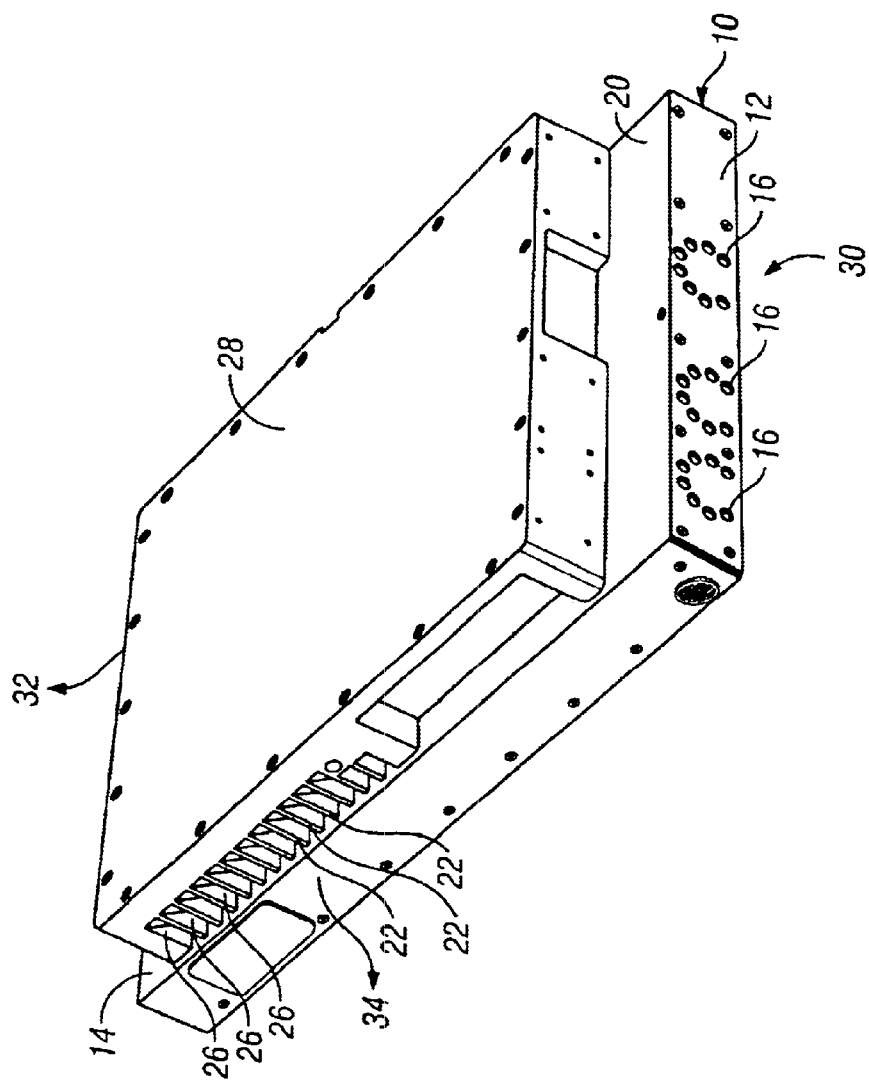
FIG. 3 is a diagram illustrating a digital and RF transceiver racked in accordance with a specific embodiment of the present invention.

FIG. 3 is a diagram illustrating a digital and RF transceivers racked in accordance with a specific embodiment of the present invention. As illustrated, the top of the transceiver (digital) 10 is coupled to the bottom of the transceiver (RF) 28. Since the present invention utilizes forced airflow, those of ordinary skill in the art will now realize that the transceivers may be physically arranged in other ways such as side-by-side or the digital transceiver may be above the transceiver. The physical arrangement of the electronic devices is not meant to be limiting. The present invention provides that the cooling holes be aligned with the heat sink fins to direct the air coming out of the cooling holes through the heat sink fins 22 and through the output of the heat sink fins 26 as shown by arrow 34. For efficient cooling of the racked transceiver (RF) 28 and transceiver (digital) 10, the air flows in through the cooling vents 16 in the direction of arrow 30, through the transceiver (digital) 10, and out through the cooling holes at the top of the transceiver (digital) in the direction of arrow 32. The air is then forced through the heat sink fins 22 and exits through the output 26 in the direction of arrow 34. In one embodiment, the temperature of the air is preferably room temperature, to allow efficient cooling of the electronic devices. The temperature of the air exiting the cooling holes will be warmer and the air exiting the output of the transceiver (RF) will be ever warmer than the air exiting the cooling holes.

Figure 4:
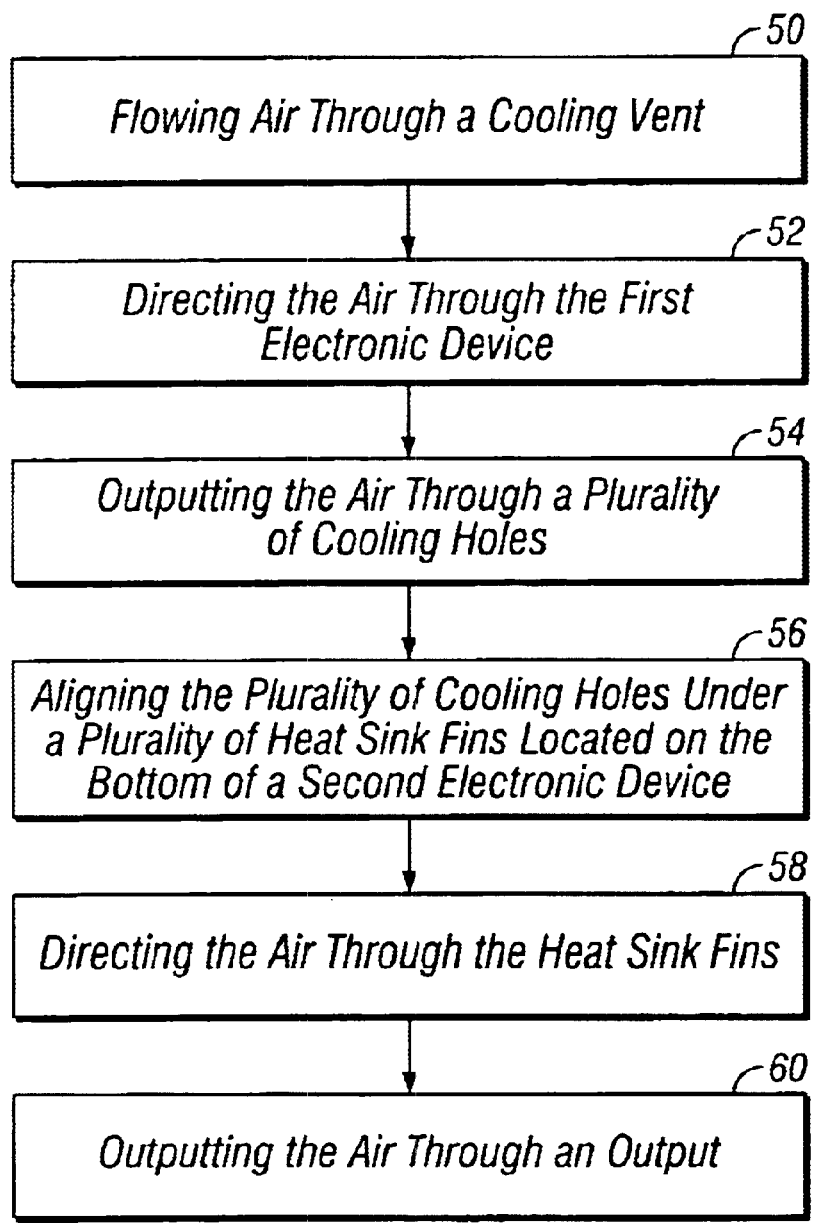
FIG. 4 is a flow diagram illustrating a method for cooling racked electronic devices in accordance with a specific embodiment of the present invention.

The present invention further provides for a method for cooling racked electronic devices. FIG. 4 is a flow diagram illustrating a method for cooling racked electronic devices in accordance with a specific embodiment of the present invention. The present invention may be used with any racked electronic devices such as a digital and RF transceiver.

Air is flown through a cooling vent at 50 in a first electronic device which may be accomplished by rotating a fan within the first electronic device. The fan is located near the cooling vent, both located at a first end of the first electronic device. The air is then directed through the first electronic device at 52 to cool the first electronic device. The air is then outputted through a plurality of cooling holes at 54 on top of the first electronic device located at a second end of the first electronic device, which is opposite the first end.

The cooling holes are aligned under a plurality of heat sink fins on the bottom of a second electronic device at 56. This facilitates the direction of air from the cooling holes through the heat sink fins at 58 that cools the second electronic device. The air is then outputted through an output of the second electronic device at 60. The heat sink fins provide an increase surface area to dissipate the heat from the second electronic device. The spacing between each heat sink fin creates channels for the forced air to escape through the output while cooling the second electronic device and other heat sink fins along the way to keep the second electronic device cool.

In an embodiment of the present invention, the cooling vents, cooling holes, and heat sink fins are made of a conducting material such as cast powder coated aluminum. Those of ordinary skill in the art will now realize that the housing of the electronic devices may be made of the conducting material for effective heat dissipation. Heat travels through material like metal, stone, brick and wood very easily since the heat will move as vibrations directly along the continuous metallic or crystalline bonds. When the position of heat particles is less restrained, the more. efficient the heat transfer convection process. Thus, for an efficient way to dissipate heat from electronic devices, the cooling vents, cooling holes, and heat sink fins should be made of a conducting material.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An apparatus to cool a plurality of racked electronic devices, comprising:
   a first electronic device having at least one cooling vent at a first end and a plurality of cooling holes at a top, each of said at least one cooling vent having a cooling fan located substantially near each of said at least one cooling vent within said first electronic device; and
   a second electronic device having a plurality of heat sink fins at a bottom, the bottom of said second electronic device coupled to the top of said first electronic device,
   wherein said plurality of heat sink fins is aligned over said plurality of cooling holes.

2. The apparatus of claim 1 wherein said plurality of cooling holes is located substantially near a second end, said second end opposite said first end.

3. The apparatus of claim 1 wherein said at least one cooling vent, said plurality of cooling holes, and said plurality of heat sink fins are made of a conducting material.

4. The apparatus of claim 1 wherein said at least one cooling vent, said plurality of cooling holes, and said plurality of heat sink fins are made of metal.

5. The apparatus of claim 1 wherein said at least one cooling vent, said plurality of cooling holes, and said plurality of heat sink fins are made of cast powder coated aluminum.

6. The apparatus of claim 1 wherein said plurality of heat sink fins further comprise an input and an output, said output located at a first side of said second electronic device.

7. The apparatus of claim 6 wherein said input is in communication with said plurality of cooling holes.

8. A method for cooling a plurality of racked electronic devices, comprising:
   flowing air through at least one cooling vent on a first end of a first electronic device, the air having a first temperature;
   outputting the air through a plurality of cooling holes on a top of said first electronic device, the air having a second temperature higher than said first temperature;
   aligning said plurality of cooling holes under a plurality of heat sink fins on a bottom of a second electronic device;
   directing the air through said plurality of heat sink fins;
   outputting the air through an output of said plurality of heat sink fins, the air having a third temperature higher than said second temperature.

9. The method of claim 8 wherein said flowing further comprises rotating a fan within said first electronic device substantially near each of said at least one cooling vent.

10. The method of claim 8 wherein said flowing further comprises circulating the air through said first electronic device.

11. The method of claim 8 wherein said plurality of cooling holes are located substantially near a second end of said first electronic device, said second end opposite said first end.

12. The method of claim 8 wherein said directing further comprises circulating said air along the bottom of said second electronic device.

13. The method of claim 8 wherein said at least one cooling vent, said plurality of cooling holes, and said plurality of heat sink fins are made of a conducting material.

14. The method of claim 8 wherein said at least one cooling vent, said plurality of cooling holes, and said plurality of heat sink fins are made of metal.

15. The method of claim 8 wherein said at least one cooling vent, said plurality of cooling holes, and said plurality of heat sink fins are made of cast powder coated aluminum.

16. An apparatus to cool a plurality of racked electronic devices, comprising:
   means for flowing air through at least one cooling vent on a first end of a first electronic device, the air having a first temperature;
   means for outputting the air through a plurality of cooling holes on a top of said first electronic device, the air having a second temperature higher than said first temperature;
   means for aligning said plurality of cooling holes under a plurality of heat sink fins on a bottom of a second electronic device;
   means for directing the air through said plurality of heat sink fins;
   means for outputting the air through an output of said plurality of heat sink fins, the air having a third temperature higher than said second temperature.

17. The apparatus of claim 16 wherein said means for flowing further comprises means for rotating a fan within said first electronic device substantially near each of said at least one cooling vent.

18. The apparatus of claim 16 wherein said means for flowing further comprises means for circulating the air through said first electronic device.

19. The apparatus of claim 16 wherein said plurality of cooling holes are located substantially near a second end of said first electronic device, said second end opposite said first end.

20. The apparatus of claim 16 wherein said means for directing further comprises means for circulating the air along the bottom of said second electronic device.

21. The apparatus of claim 16 wherein said at least one cooling vent, said plurality of cooling holes, and said plurality of heat sink fins are made of a conducting material.

22. The apparatus of claim 16 wherein said at least one cooling vent, said plurality of cooling holes, and said plurality of heat sink fins are made of metal.

23. The apparatus of claim 16 wherein said at least one cooling vent, said plurality of cooling holes, and said plurality of heat sink fins are made of cast powder coated aluminum.

24. A system for cooling a plurality of racked electronic devices, comprising:
- a first electronic device having at least one cooling vent at a first end and a plurality of cooling holes at a top, each of said at least one cooling, vent having a cooling fan located substantially near each of said at least one cooling vent;
- means for flowing air through said at least one cooling vent within said first electronic device;
- means for outputting the air flow through a plurality of cooling holes on the top of said first electronic device;
- a second electronic device having a plurality of heat sink fins at a bottom, the bottom of said second electronic device coupled to the top of said first electronic device,
- means for aligning said plurality of cooling holes under said plurality of heat sink fins; and
- means for outputting the air through an output of said plurality of heat sink fins.

25. The system of claim 24 wherein said plurality of cooling holes is located substantially near a second end, said second end opposite said first end.

26. The system of claim 24 wherein said at least one cooling vent, said plurality of cooling holes, and said plurality of heat sink fins are made of a conducting material.

27. The system of claim 24 wherein said at least one cooling vent, said plurality of cooling holes, and said plurality of heat sink fins are made of metal.

28. The system of claim 24 wherein said at least one cooling vent, said plurality of cooling holes, and said plurality of heat sink fins are made of cast powder coated aluminum.

29. The system of claim 24 wherein said plurality of heat sink fins further comprise an input and an output, said output located at a first side of said second electronic device.

30. The system of claim 24 wherein said means for flowing further comprises means for rotating said cooling fan.

31. The system of claim 24 wherein said means for flowing further comprises means for circulating said air through said first electronic device.

32. The system of claim 24 wherein said means for directing;further comprises means for circulating said air through the bottom of said second electronic device.

* * * * *

UNITED STATES PATENT AND TRADEMARK OFFICE
CERTIFICATE OF CORRECTION

PATENT NO. : 6,667,883 B1
DATED : December 23, 2003
INVENTOR(S) : Craig Solis and Peter Smidth It is certified that error appears in the above-identified patent and that said Letters Patent is hereby corrected as shown below:

Column 1,
Line 21, replace "enviroment" with -- environment --.

Signed and Sealed this

Twenty-ninth Day of June, 2004

JON W. DUDAS
*Acting Director of the United States Patent and Trademark Office*